(12) United States Patent
Holsteyns et al.

(10) Patent No.: US 7,527,698 B2
(45) Date of Patent: May 5, 2009

(54) METHOD AND APPARATUS FOR REMOVING A LIQUID FROM A SURFACE OF A SUBSTRATE

(75) Inventors: Frank Holsteyns, Diest (BE); Marc Heyns, Linden (BE); Paul W. Mertens, Bonheiden (BE)

(73) Assignee: Interuniversitair Microelektronica Centrum (IMEC, VZW), Leuven (BE)

(*) Notice: Subject to any disclaimer, the term of this patent is extended or adjusted under 35 U.S.C. 154(b) by 325 days.

(21) Appl. No.: 10/430,489

(22) Filed: May 6, 2003

(65) Prior Publication Data

US 2004/0045589 A1    Mar. 11, 2004

Related U.S. Application Data

(60) Continuation-in-part of application No. 10/097,830, filed on Mar. 13, 2002, now Pat. No. 6,568,408, which is a division of application No. 09/159,801, filed on Sep. 23, 1998, now Pat. No. 6,491,764.

(60) Provisional application No. 60/407,581, filed on Aug. 30, 2002.

(51) Int. Cl.
*B08B 3/04* (2006.01)

(52) U.S. Cl. .............. 134/26; 134/21; 134/23; 134/24; 134/25.5; 134/30; 134/32; 134/33; 134/36; 134/42; 134/94.1; 134/95.1; 134/95.3; 134/99.1; 134/100; 134/148; 134/153; 134/180; 134/181; 134/902

(58) Field of Classification Search ............... 134/94.1, 134/95.1, 95.3, 99.1, 100.1, 181, 180, 902, 134/148, 153, 21, 23, 24, 25.5, 26, 30, 32, 134/33, 36, 42
See application file for complete search history.

(56) References Cited

U.S. PATENT DOCUMENTS 3,954,649 A * 5/1976 Lamberti .................... 510/348

(Continued)

FOREIGN PATENT DOCUMENTS

JP        07211686        8/1995

(Continued)

OTHER PUBLICATIONS

European Search Report, Application No. 98 87 0200 dated Jan. 6, 1999.

(Continued)

*Primary Examiner*—Sharidan Carrillo
(74) *Attorney, Agent, or Firm*—McDonnell Boehnen Hulbert & Berghoff LLP

(57) ABSTRACT

A method and apparatus for removing a first liquid from a surface of a substrate is provided. A second liquid is supplied to at least part of a surface of a substrate having a rotary movement. The rotary movement has a center of rotation and an edge of rotation. The second liquid is directed from the center of rotation to the edge of rotation using a nozzle. A dry zone is created on the substrate as the position of the spray moves from the center of rotation to the edge of rotation. As a result, the first liquid and the second liquid are removed from the surface of the substrate.

22 Claims, 13 Drawing Sheets

U.S. PATENT DOCUMENTS

| | | | |
|---|---|---|---|
| 4,027,686 A | 6/1977 | Shortes et al. | 134/33 |
| 4,838,289 A | 6/1989 | Kottman et al. | |
| 4,871,417 A | 10/1989 | Nishizawa et al. | |
| 5,271,774 A * | 12/1993 | Leenaars et al. | 134/31 |
| 5,375,291 A | 12/1994 | Tateyama et al. | |
| 5,601,655 A * | 2/1997 | Bok et al. | 134/1 |
| 5,634,980 A * | 6/1997 | Tomita et al. | 134/3 |
| 5,646,071 A * | 7/1997 | Lin et al. | 438/763 |
| 5,660,642 A | 8/1997 | Britten | 134/30 |
| 5,705,223 A | 1/1998 | Bunkofske | |
| 5,749,413 A | 5/1998 | Crowe | |
| 5,873,380 A | 2/1999 | Kanno | 134/102.1 |
| 5,882,433 A | 3/1999 | Ueno | 134/31 |
| 5,887,605 A | 3/1999 | Lee et al. | 134/102.2 |
| 5,945,351 A | 8/1999 | Mathuni | |
| 5,964,952 A | 10/1999 | Kunze-Concewitz | 134/2 |
| 5,997,653 A | 12/1999 | Yamasaka | 134/2 |
| 6,334,902 B1 | 1/2002 | Mertens et al. | 134/1 |
| 6,398,975 B1 | 6/2002 | Mertens et al. | |
| 6,488,040 B1 * | 12/2002 | de Larios et al. | 134/95.2 |
| 6,491,764 B2 * | 12/2002 | Mertens et al. | 134/36 |
| 6,770,151 B1 * | 8/2004 | Ravkin et al. | 134/33 |
| 6,851,435 B2 | 2/2005 | Mertens et al. | |
| 2004/0115567 A1* | 6/2004 | Mandal et al. | 430/324 |
| 2005/0121059 A1* | 6/2005 | Boyd et al. | 134/102.3 |

FOREIGN PATENT DOCUMENTS

| | | |
|---|---|---|
| JP | 938595 | 2/1997 |
| JP | 09162159 | 6/1997 |

OTHER PUBLICATIONS

International Search Report from EP 00870135.

* cited by examiner

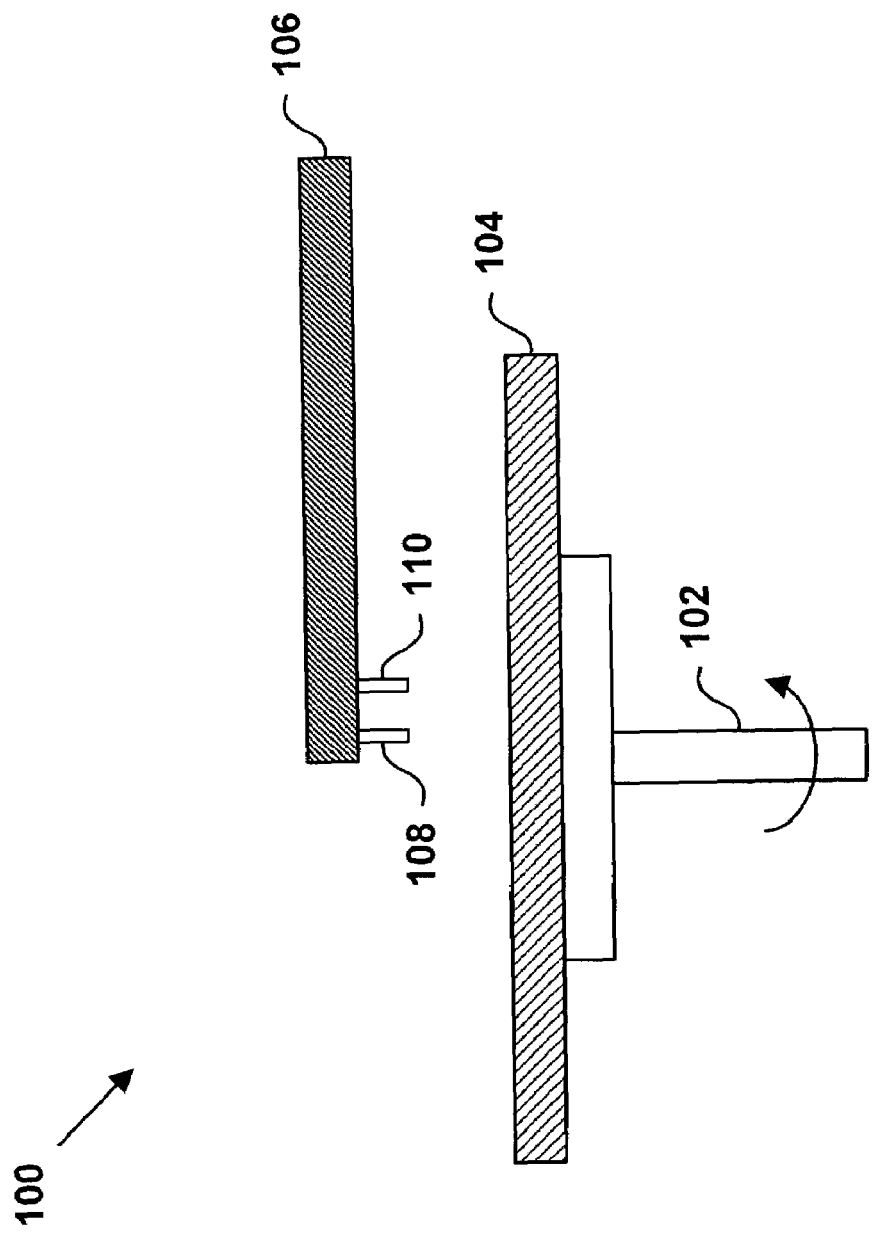

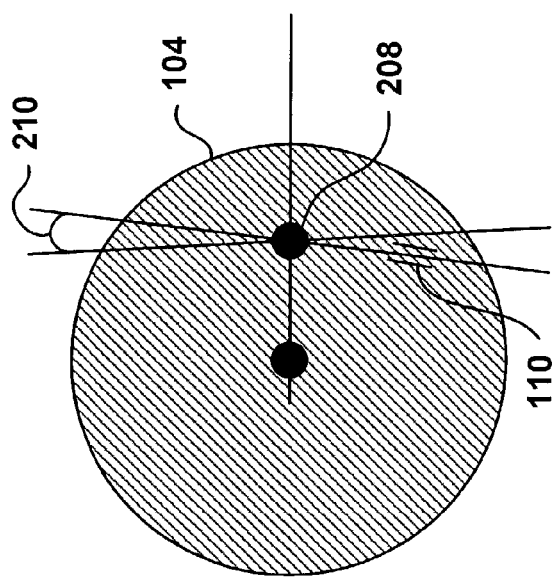
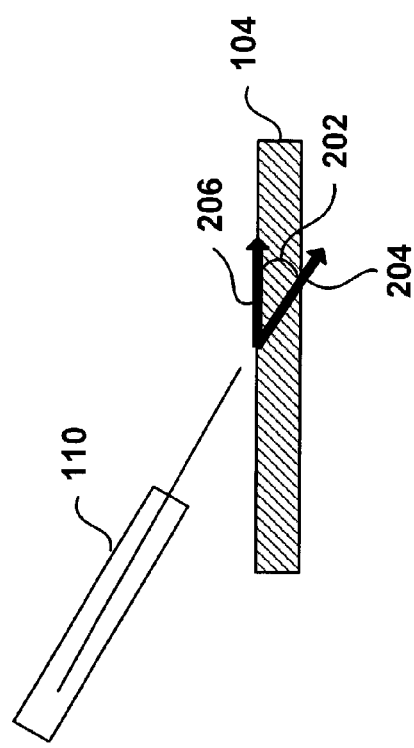
Fig. 2a
Fig. 2b

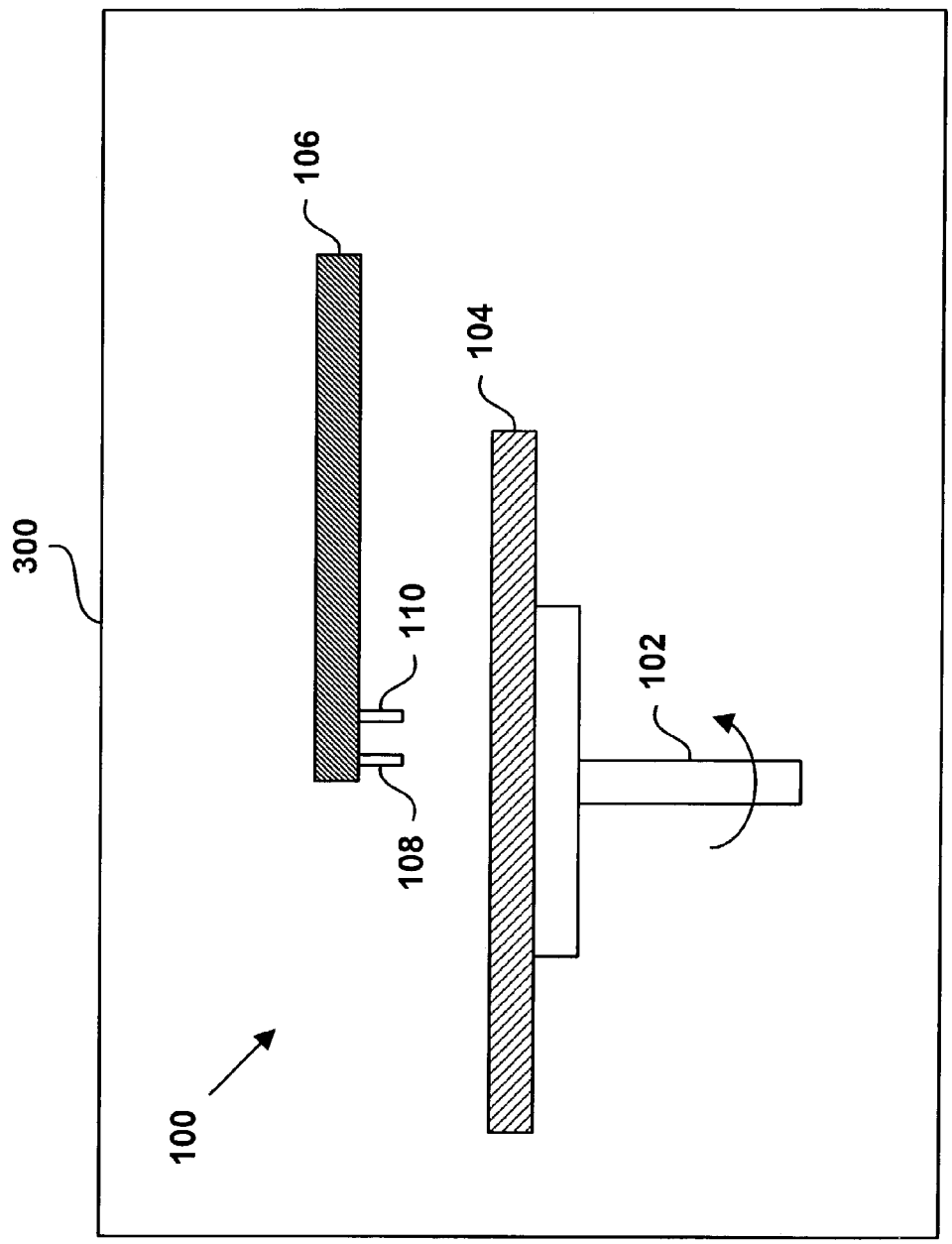

| NOZZLE 814 | NOZZLE 108, 708, 808 | NOZZLE 110, 710, 810 | NOZZLE 712, 812 | FIGURE |
|---|---|---|---|---|
| ON | OFF | ON | OFF | 8 |
| ON | OFF | ON | ON | 8 |
| OFF | ON | ON | ON | 7 |
| OFF | OFF | ON | OFF | 1, 7, 8 |
| OFF | ON | ON | OFF | 1, 7, 8 |
| OFF | OFF | ON | ON | 7 |

Fig. 9

| EXPERIMENT | 1008 | 1010 | 1012 |
|---|---|---|---|
| 1.1 | ON | ON | OFF |
| | ON | ON | ON |
| 1.2 | OFF | ON | OFF |
| | OFF | ON | ON |

Fig. 11

| EXPERIMENT | 1008 | 1010 | 1012 |
|---|---|---|---|
| 2.1 | OFF | OFF | OFF |
| 2.2 | ON | ON | OFF |
| 2.3 | ON | ON | ON |

Fig. 12

METHOD AND APPARATUS FOR REMOVING A LIQUID FROM A SURFACE OF A SUBSTRATE

CROSS REFERENCE TO RELATED APPLICATIONS

This application is a continuation-in-part of U.S. patent application Ser. No. 10/097,830, filed Mar. 13, 2002, now U.S. Pat. No. 6,568,408, which is a divisional application of U.S. patent application Ser. No. 09/159,801, filed Sep. 23, 1998, now U.S. Pat. No. 6,491,764. This application also claims priority to U.S. provisional application Ser. No. 60/407,581, filed on Aug. 30, 2002.

U.S. utility application Ser. No. 10/097,830, U.S. utility application Ser. No. 09/159,801, U.S. Pat. No. 6,491,764, U.S. patent application Ser. No. 09/022,834, European patent application No. 988700563, U.S. provisional application Ser. No. 60/059,929, U.S. provisional application Ser. No. 60/079,688, U.S. provisional application Ser. No. 60/084,651, and U.S. provisional application Ser. No. 60/407,581 are incorporated by reference in their entirety.

FIELD

The present invention relates generally to semiconductor processing, and more particularly, relates to removing a liquid from at least a portion of a surface of a substrate.

BACKGROUND

Substrates are commonly exposed to liquids during semiconductor processing. For example, a substrate may be chemically etched and cleaned many times during the course of fabrication. Typically, a water rinse follows each etch and cleaning operation. It is important that any liquid is removed, preferably completely, from the substrate to avoid defects in the finished product.

Many of the semiconductor processing operations that involve liquids are performed in a batch mode. However, many other processing operations are performed in a single substrate mode. For example, the processing operations of dry etching and deposition are typically performed on an individual substrate. Because of the variable delay between the cleaning process and other processes caused by having both batch and single substrate modes of processing, it would be desirable to have a single mode of processing a substrate.

One of the difficulties in converting the wet processing operations from a batch mode to a single substrate mode is the inability to remove liquids completely from the surface of a substrate during single substrate processing. One of the reasons for this difficulty is that in a single substrate mode the substrate is generally positioned horizontally. The difficulty arises because the liquids need to be removed from both the top and bottom surfaces of the substrate when positioned horizontally.

One common method of removing liquids from a substrate surface is based on the Marangoni principle. The Marangoni principle provides that when substrates are pulled slowly through a water surface and a surface tension lowering substance is added, the surface tension gradient draws the water away from the surface, leaving it dry. However, liquid removal techniques that rely on the Marangoni principle require the substrates to be located in a vertical position.

Spin drying methods allow for horizontal substrate positioning. Spin dryers use high-speed rotation to literally throw the liquid off of the substrate surface. However, this technique leaves undesirable residues, commonly referred to as drying marks, on the substrate surface. These drying marks are undesirable as they can cause defects in the finished product.

A further limitation associated with removing liquids from a substrate surface in a single substrate operation mode is the desire to be efficient. Current semiconductor production lines process a substrate approximately every 1 to 3 minutes. Ideally, a liquid removal operation should also be completed in this amount of time.

Drying methods that use surface tension reducing vapor do not efficiently remove liquid from a horizontally positioned substrate. In this regard, because the surface tension reducing vapor is passively applied, it is difficult to control the vapor and to efficiently remove the liquids. Additionally, such methods may not be suitable for removing liquids simultaneously from both the top and the bottom of a substrate that is horizontally positioned.

Therefore, it would be desirable to have a system and method of efficiently removing liquid from a surface of a substrate positioned horizontally in a single substrate processing mode.

SUMMARY

In a first aspect of the invention, a method of treating at least a portion of one surface of a substrate is provided. The method comprises subjecting the substrate to movement and supplying only liquid (i.e., not supplying a gas) to at least a part of said surface of said substrate, wherein the subjecting of the substrate to movement and the supplying of only liquid cooperatively remove the liquid from at least a portion of one surface of a substrate. The substrate movement may preferably be rotary movement, or alternatively may be a linear or sweeping movement. The substrate movement should be understood as relative movement between the substrate and a liquid dispensing system. At least part of the surface of the substrate may be lyophobic. Also, at least part of the surface of the substrate may be lyophilic and lyophobic.

In a first embodiment of the first aspect of the invention, only a liquid (and no gas) is supplied. The liquid may be a non-wetting liquid with respect to the substrate. The term non-wetting liquid as used in this specification means a liquid that is substantially removed from the surface of the substrate without leaving a liquid trace when an external force, such as centrifugal force or gravity, is applied to the substrate. A contact angle between the non-wetting liquid and the substrate may be greater than 5 degrees, and preferably greater than 10 degrees. The liquid may include dissolved gasses and solids. The liquid may be a dilute aqueous solution. For example, the liquid may be an aqueous solution containing a dissolved gaseous substance, the gaseous substance replacing at least a portion of oxygen present in the aqueous solution (to avoid undesirable oxidation of the substrate).

The liquid may be a rinsing liquid. For example, the rinsing liquid may comprise $H_2O$, or a mixture of $H_2O$ and an acid, the mixture having a pH between 2 and 6. The liquid may also be a cleaning liquid. For example, the cleaning liquid may comprise a mixture of $NH_4OH$, $H_2O_2$ and $H_2O$; a mixture of $HCl$, $H_2O_2$ and $H_2O$; or diluted $HCl$; or a mixture comprising $O_3$. The liquid may also be an etching liquid.

Subjecting the substrate to movement comprises subjecting the substrate to rotary movement, wherein the rotary movement has a center of rotation and an outer edge of rotation, and wherein supplying the non-wetting liquid comprises supplying the non-wetting liquid to the substrate in a direction from the center of rotation to the outer edge of rotation. Furthermore, subjecting the substrate to movement comprises subjecting the substrate to rotary movement having a center of rotation, and wherein supplying the non-wetting liquid comprises supplying the non-wetting liquid using at least one nozzle. The nozzle directs the non-wetting liquid from substantially a center of the substrate towards an outer edge of the substrate.

In a second embodiment of the first aspect of the invention, at least two liquids (and no gas) are supplied. The first liquid may be a non-wetting liquid with respect to the substrate and the second liquid may be a wetting liquid with respect to the substrate. The term wetting liquid as used in this specification means a liquid that partly remains on the surface of the substrate when an external force, such as centrifugal force or gravity, is applied to the substrate. A contact angle between the wetting liquid and the substrate may be less than 5 degrees, and preferably less than 3 degrees.

The wetting liquid may be supplied prior to the non-wetting liquid, meaning that a point of impingement of the wetting liquid is closer to the outer edge of the substrate as compared with the point of impingement of the non-wetting liquid. Preferably, the wetting liquid is supplied in order to obtain a complete wetting of the substrate. Wetting may be understood as completely covering (or substantially covering) the substrate so that there are no regions on the substrate where the liquid pulls together and forms droplets. To aid in wetting, a surfactant may be included in the wetting liquid. The non-wetting liquid may be the same as the non-wetting liquid disclosed in the first embodiment of the first aspect of the invention. When rotating the substrate, the wetting liquid may be supplied closer to an edge of the substrate relative to the supplying of the non-wetting liquid.

In a third embodiment of the first aspect of the invention, at least three liquids (and no gas) are supplied. The first liquid may be a first wetting liquid, the second liquid may be ultra pure water, and the third liquid may be a second wetting liquid. The ultra pure water may be supplied between the first and second wetting liquids.

In a second aspect of the invention, a method of removing a liquid from at least a portion of one surface of a substrate is provided. The method comprises subjecting the substrate to a rotary movement, supplying liquid to at least a part of said surface of said substrate, and supplying a gaseous substance to at least a section of said surface of said substrate, supplying a gaseous substance being performed, at least a part of the time, simultaneously with supplying a liquid, wherein the supplying of a liquid and the supplying of a gaseous substance cooperatively remove liquid from at least a portion of one surface of a substrate.

In a first embodiment of the second aspect of the invention, the gaseous substance supplied may be a gas that is inert with respect to the substrate. Examples of gases that are inert with respect to the substrate include nitrogen, argon, helium and hydrogen. The liquid supplied may be a single liquid (such as described in the first embodiment of the first aspect of the invention) or may be at least two liquids (such as described in the second embodiment of the first aspect of the invention).

In a second embodiment of the second aspect of the invention, the gaseous substance supplied may be a surface tension lowering gas. For example, the gaseous substance may be at least partially miscible with said liquid and when mixed with said liquid yields a mixture having a surface tension being lower than that of said liquid. The liquid supplied may be a single liquid (such as described in the first embodiment of the first aspect of the invention), two liquids (such as described in the second embodiment of the first aspect of the invention), or at least three liquids (such as described in the third embodiment of the first aspect of the invention).

BRIEF DESCRIPTION OF THE DRAWINGS

Presently preferred embodiments are described below in conjunction with the appended drawing figures, wherein like reference numerals refer to like elements in the various figures, and wherein:

FIG. 1 is a side view of a tool used for removing a liquid from a substrate, according to an exemplary embodiment;

FIG. 2a is a top view of a substrate in which liquid is removed, according to an exemplary embodiment;

FIG. 2b is a side view of a substrate in which liquid is removed, according to an exemplary embodiment;

FIG. 3 is a side view of a chamber containing the tool depicted in FIG. 1, according to an exemplary embodiment;

FIG. 9 is a table summarizing examples of some embodiments disclosed in the present application;

FIG. 11 is a table summarizing some experimental test setups using the tool of FIG. 10;

FIG. 12 is a table summarizing some additional experimental test setups using the tool of FIG. 10.

DETAILED DESCRIPTION

Figure 4:
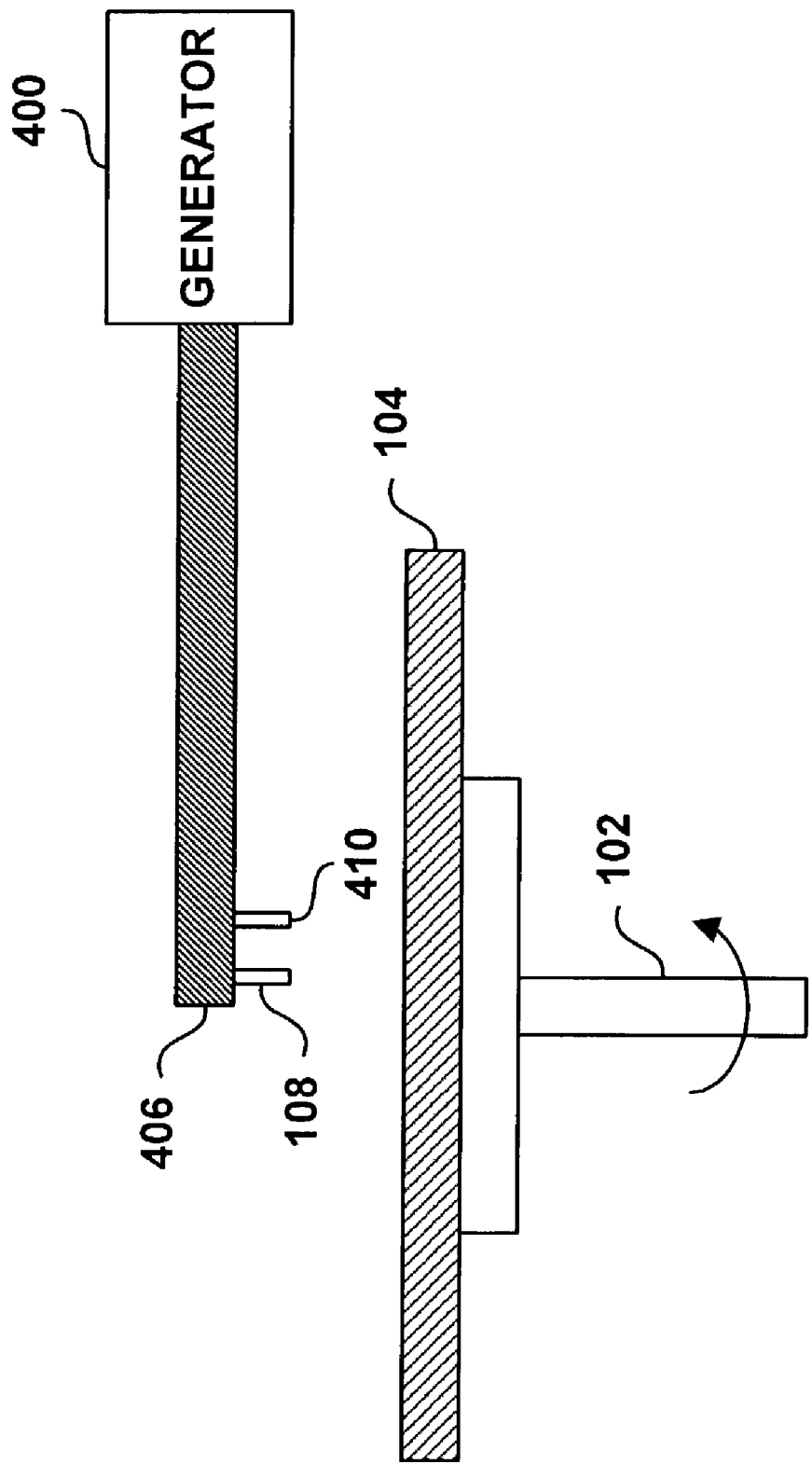
FIG. 4 is a side view of a tool that includes a megasonic energy generator for removing a liquid from a substrate, according to an exemplary embodiment.

FIG. 1 depicts a side view of a tool 100 used for removing a liquid from a substrate 104. The tool 100 is substantially similar to the tool disclosed in one embodiment of U.S. Pat. No. 6,491,764. U.S. Pat. No. 6,491,764 is incorporated by reference in its entirety.

As shown in FIG. 1, a substrate holder 102 holds substrate 104. The substrate holder 102 depicted in FIG. 1 is only an example. Other methods of holding the substrate 104 may be possible. For example, the substrate holder 102 may hold the substrate 104 by clamping onto the outer edges of the substrate 104.

In a preferred embodiment, the substrate holder 102 may spin the substrate 104 in a rotary movement. The rotary movement may have a center of rotation and an edge of rotation. The substrate 104 may be substantially perpendicular to an axis of rotation. The speed of the rotation may be in the range of substantially 2 to 40 revolutions per second. The speed may be variable during the process. The substrate 104 may be rotated around its own center. However, the substrate 104 may also be rotated off-center. Alternatively, the substrate holder 102 may hold the substrate 104 in a stationary position or move the substrate 104 in a non-rotational manner, such as a linear movement.

In another embodiment, a substrate holder may hold more than one substrate in a "wheel" formation. As the wheel rotates, the substrate holder may subject the substrates to rotary movement. The substrates themselves may be rotating or stationary as the wheel rotates. The rotary movement of the wheel may have a center of rotation and an edge of rotation. The wheel may be rotated around its own center or rotated off-center.

The substrate 104 may be any type of substrate used in the process of semiconductor processing. For example, the substrate 104 may be composed of silicon, gallium arsenide, or glass. At least part of the surface of the substrate 104 may be lyophobic, lyophilic, or a mixture of lyophobic and lyophilic. However, in a preferred embodiment at least part of the surface of the substrate 104 is lyophobic. The surface of the substrate 104 may contain a patterned layer. The patterned layer may be formed during semiconductor fabrication and may include openings, such as trenches and holes.

A movable arm 106 may be located substantially above the substrate 104. To maximize a capillary effect during the liquid removal process, the distance between the moveable arm 106 and the substrate 104 may be approximately 5 mm or less. However, this invention is not limited to that distance.

The moveable arm 106 may consist of at least two supply systems. The first supply system may be a gaseous supply system for supplying a gaseous substance to the substrate 104. The second supply system may be a liquid supply system for supplying a liquid to the substrate 104. The gaseous and liquid supply systems may include one or more nozzles capable of supplying gasses and liquids, respectively, to the substrate 104.

For example, FIG. 1 depicts two nozzles 108 and 110 located on the moveable arm 106. In this example, a gas may be supplied to the substrate 104 via nozzle 108. Further, a liquid may be supplied to the substrate 104 via nozzle 110. The moveable arm 106 may include additional gas and/or liquid nozzles.

Alternatively, more than one moveable arm may be used. For example, one moveable arm may include one or more nozzles that supply gas, while another moveable arm may include one or more nozzles that supply liquid. As another example, each nozzle may be located on a separate moveable arm. As yet another example, one moveable arm may contain both gas and liquid nozzles and another moveable arm may contain another combination of gas and liquid nozzles.

The movable arm 106 may be moved to position the nozzles 108, 110 substantially above the substrate 104. For example, the moveable arm 106 may move in such a manner as to cause the nozzles 108, 110 to move from substantially a center of rotation to substantially an edge of rotation. The movement of the nozzles 108, 110 from the center to the edge of the rotation may be a linear, rotational, or a sweeping movement (e.g. in the form of an arc).

To ensure the liquid is removed from the substrate 104, the translational speed, v, at which the arm 106 moves, and, therefore, the speed at which the nozzles 108, 110 move, may be adapted to the rotational speed, ω, of the substrate 104. If Δr is the translation distance per revolution, the rotational speed can be chosen such that:

$$\Delta r = \frac{2\pi v}{\omega} \qquad \text{Equation 1}$$

The translational distance is the radial distance over which the liquid boundary extends radially during one revolution. For example, if the translation distance per revolution, Δr, equals 1 mm and that the translational speed, v, equals 1 mm per second, then the rotational speed, ω, is 1 revolution per second.

In one embodiment, the nozzles are located such that their center lines draw concentric circles on the surface with a difference in radius on the order of 5 mm. By doing so, a curved liquid boundary is formed, which is initially located at the center of rotation. The moveable arm 106 slowly guides the liquid boundary from the center to the edge of rotation. As a result, the liquid is removed from the surface of the substrate 104.

In another embodiment, the moveable arm 106 may be stationary, while the substrate holder 102 moves the substrate 104 relative to the position of the arm 106, and therefore, relative to the nozzles 108, 110. In this embodiment, the movement of the substrate holder 102, and, therefore, the movement of the substrate 104 may be a linear, rotational, or sweeping movement with respect to the location of the moveable arm 106. The movement of the substrate holder 102 may be such that the nozzles 108, 110 are initially located substantially above the center of rotation and eventually are located substantially above the edge of rotation.

In yet another embodiment, the substrate holder 102 and movable arm 106 may both move. In one example of this embodiment, the substrate holder 102 and the movable arm 106 may both move in a substantially linear fashion relative to one another. Specifically, the substrate holder 102 and the moveable arm 106 may move in such a manner that the substrate 104 is subject to substantially a linear movement relative to the nozzles 108, 110.

The nozzles 108, 110 may also move in such a manner as to direct the flow of gas and/or liquid onto the substrate surface 104. In this embodiment, the substrate 104 and the moveable arm 106 may move with respect to each other or may remain stationary. The nozzles 108, 110 may direct the flow of the gas and/or liquid supplied to the substrate 104 from substantially the center to the edge of rotation. The nozzles 108, 110 may be angled to control the direction of the flow of the gas and/or liquid.

While the movement of the nozzles 108, 110 with respect to the substrate 104 may be accomplished in all manners described above and their equivalents, the remainder of this specification will describe the moveable arm 106 moving the nozzles 108, 110 relative to the position of the substrate 104. However, it will be understood that such movement is not limited in this respect.

FIG. 2a is a top view of a substrate and FIG. 2b is a side view of a substrate in which liquid is removed. In order to limit splashing of the liquid, an angle 202 between the velocity vector of the liquid 204 when leaving the nozzle 110 and the velocity vector of the rotating surface 206 at a point 208 where the liquid flow impinges may be reduced. Additionally, the nozzle 110 may be slightly angled outwards. For example, the angle 210 may be substantially between 0 and 5 degrees.

Referring again to FIG. 1, in one embodiment of the invention, a substance consisting of a non-gaseous form may be supplied to the substrate 104. For example, a liquid may be supplied to the substrate 104. In one embodiment, a single liquid may be supplied to the substrate 104. However, more than one liquid may be supplied.

The single liquid may be supplied to the substrate 104 via nozzle 110 located on movable arm 106. The single liquid may include dissolved gasses and/or dissolved solids. The single liquid may be a non-wetting liquid with respect to the substrate 104. The term non-wetting liquid as used in this specification means a liquid that is substantially removed from the surface of the substrate without leaving a liquid trace when an external force, such as centrifugal force or gravity, is applied to the substrate. A contact angle between the non-wetting liquid and the substrate may be greater than 5 degrees, and preferably greater than 10 degrees.

Preferably the single liquid is a rinsing liquid. However, the single liquid may also be a cleaning liquid or an etching liquid. The cleaning liquid may be comprised of a mixture of $NH_4OH$, $H_2O_2$ and $H_2O$; a mixture of HCl, $H_2O_2$ and $H_2O$; diluted HCl; or a mixture containing $O_3$. The rinsing liquid may be comprised of $H_2O$, or a mixture of $H_2O$ and an acid. The mixture of $H_2O$ and the acid may have a pH value between 2 and 6.

The single liquid supplied to the substrate 104 may be an aqueous solution that contains a dissolved gaseous substance. The gaseous substance may be capable of removing at least a portion of the oxygen present in the aqueous solution. This may be beneficial because oxygen may negatively affect the quality of the substrate 104. For example, if the substrate 104 is a silicon substrate, oxygen in the single liquid may chemically react with the silicon surface causing oxidation of the substrate. Oxidation may cause dissolved silicates to form, which may precipitate onto the substrate surface. As a result of the precipitation, the substrate 104 may become contaminated causing defects in the final product.

Alternatively, the single liquid may be supplied to the substrate 104 in an ambient having a low oxygen concentration. Such an ambient may contain less oxygen than found in atmospheric air. For example, the tool 100 may be located in a chamber 300 as depicted in FIG. 3. The chamber 300 may contain an ambient that has a low oxygen concentration. As one example, the chamber 300 may contain a nitrogen atmosphere. However, other low oxygen atmospheres may also be provided in the chamber 300. By providing a low oxygen atmosphere, oxidation of the substrate surface may be reduced and/or eliminated.

An additional force may be exerted on the single liquid. For example, megasonic energy may be used to agitate the single liquid. As shown in FIG. 4, a megasonic generator 400 may be integrated into the liquid-supply system and directly transmit the megasonic energy to the single liquid. The energy may then be transferred to the surface of the substrate 104 via the single liquid.

The megasonic generator 400 may be connected to a megasonic liquid nozzle 410 and/or a megasonic liquid arm 406. The megasonic generator 400 may include a transducer and a transmitter. The transmitter may be cylindrical in shape and extend along, for the tool 100, the moveable arm 106, or, for the tool 400, the megasonic liquid arm 406.

In certain embodiments, a gas may be supplied to the substrate 104. The gas may be supplied to the substrate 104 via nozzle 108. The gas may be an inert gas with respect to the substrate 104. For example, the inert gas may be nitrogen, argon, helium, or hydrogen. At least part of the time, the gas may be supplied substantially simultaneously with the single liquid. The nozzle 108 is turned on if both the single liquid and the gas are supplied to the substrate 104. However, the nozzle 108 is turned off if only the single liquid is supplied to the substrate 104.

In certain embodiments, a method of removing liquids from a substrate may comprise dispensing a single liquid onto at least a part of the rotating substrate 104. For example, the nozzle 110 may spray a non-wetting liquid from substantially the center of rotation to the edge of rotation. The rotational speed of the substrate 104 may be chosen such that the flow of the single liquid is transported outwards due to centrifugal forces. The substrate 104 may be rotated as demonstrated in FIG. 5.

Figure 5:
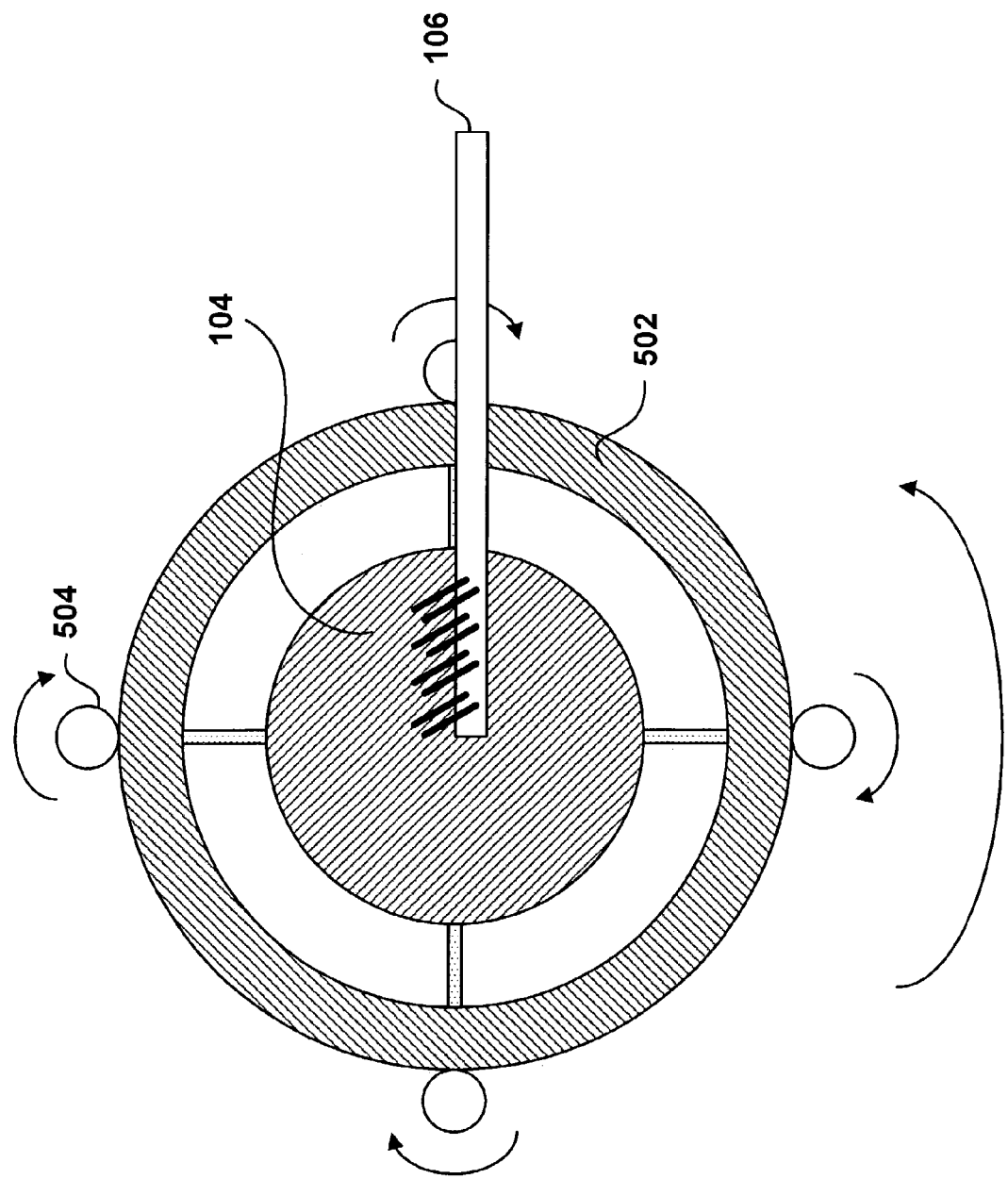
FIG. 5 is a top view of a tool used for removing a liquid from a substrate, according to an exemplary embodiment.

FIG. 5 is a top view of a tool used for removing a liquid from a substrate. The substrate 104 may be clamped into a ring-shaped substrate holder 502. The substrate holder 502 may have an inner diameter larger that the diameter of the substrate 104. The clamping may be performed in such a manner as to minimize the contact with the substrate surface. The substrate holder 502 may be placed between at least two revolving cylinders 504. Four revolving cylinders are shown in FIG. 5; however, more or less than four revolving cylinders may be used. The revolving cylinders 504 may transmit a rotational force to the substrate 104 by rotating the substrate holder 502. Alternatively, the revolving cylinders 504 may directly rotate the substrate 104. Other methods for rotating the substrate may also be used.

Figure 6:
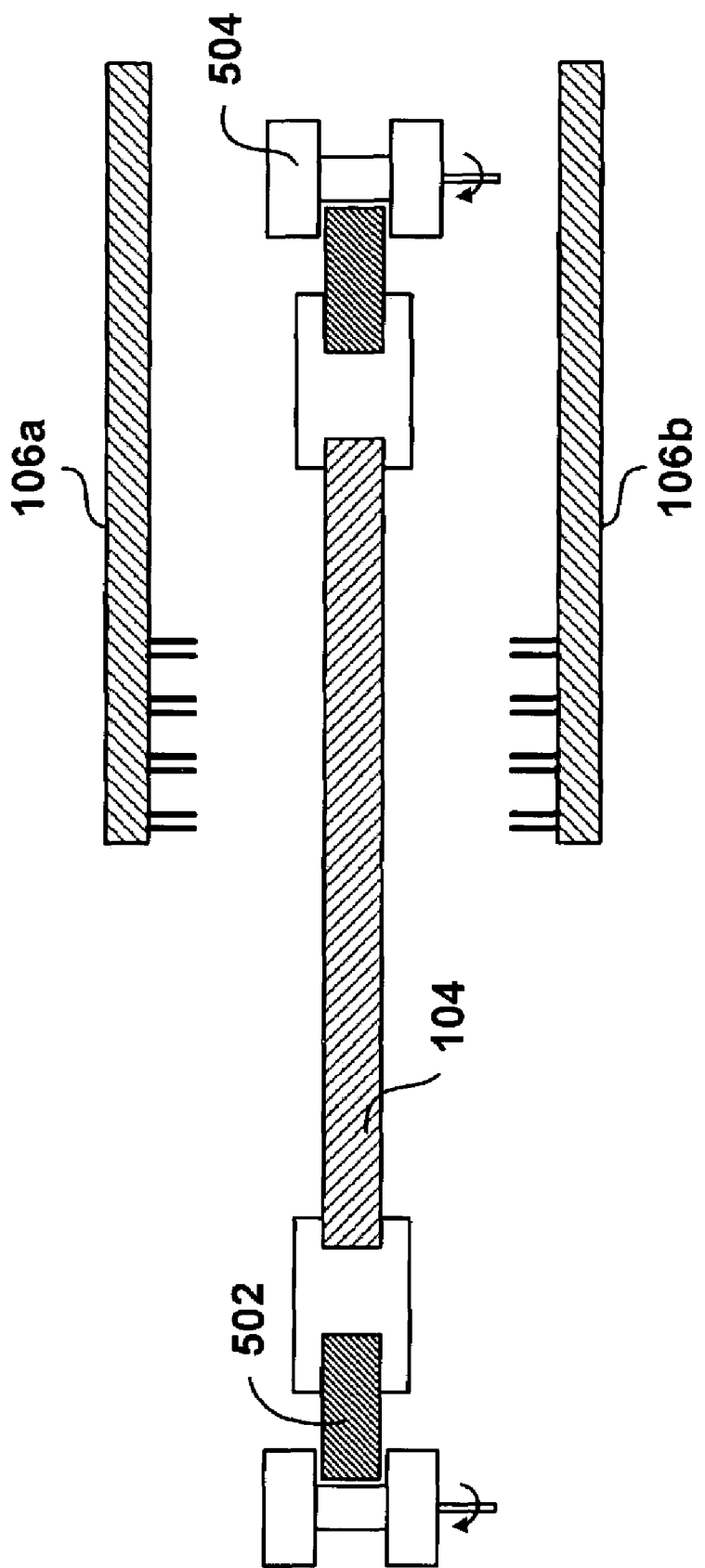
FIG. 6 is a side view of a tool used for removing a liquid from both a top and a bottom of a substrate, according to an exemplary embodiment.

FIG. 6 is a side view of a tool depicted in FIG. 5. FIG. 6 may be helpful to demonstrate how the tool can be used to remove liquids from both a top and a bottom of a substrate 104. Two moveable arms 106a, 106b may be guided separately or simultaneously from substantially the center to the edge of rotation. The first moveable arm 106a extends above the top of the substrate 104, while the second moveable arm 106b extends below the bottom of the substrate 104.

Each of the moveable arms 106a, 106b includes a liquid supply system. The liquid supply systems include at least one nozzle for supplying the single liquid to the substrate 104. By guiding the single liquid supplied to both the top and the bottom of the substrate 104 from substantially the center to the edge of rotation, liquids will be removed from both the top and the bottom of the substrate 104.

The geometry and position of the nozzle 110 located on the moveable arm 106 may be adapted to the type of substrate 104 and/or to the type of liquid being removed from the surface of the substrate 104. In a preferred embodiment, the flow of the single liquid and the geometry of the nozzle 110 may be chosen to create a stable liquid front. Additionally, the flow and the nozzle 110 may be designed to cover the part of the substrate from which liquid is being removed.

In this method of removing liquids from a substrate 104, the rinsing and drying of the substrate 104 may occur substantially simultaneously by moving the flow of the single liquid from substantially the center to the edge of rotation. The liquid may be removed from the surface of the substrate 104 using centrifugal forces. A dry zone may be created in the center of rotation and extend to the edge of rotation as the position of the spray moves towards the edge of rotation.

The following example is provided to further explain this system and method of removing liquid from a substrate. The rinse and dry operations may be integrated into a single operation by spraying ultra pure water on the surface of the substrate. In this example, HF-last silicon substrates were sprayed with ultra pure water having a contact angle of approximately 70 degrees. By directing the flow from the nozzle from substantially the center to the edge of the rotating substrate while dispensing ultra pure water onto the silicon substrate, the substrate was rinsed and dried substantially simultaneously without creating significant defects. Referring to FIG. 2, the angle 210 is between 0 and 5 degrees, while the angle 202 is between 2 and 90 degrees, preferably below 50 degrees and preferably about 20 degrees.

This example was performed using a ⅛-inch outer diameter nozzle with a water-flow through rate of approximately 2 ml/sec. The moveable arm speed reached a maximum of 15 mm/sec, while the substrate holder rotational speed was approximately 5 revolutions per second. The substrate was dried and the particle performance was close to particle neutral, which is the measure of defects added to the surface of the substrate when measured with a light scattering tool.

Figure 7:
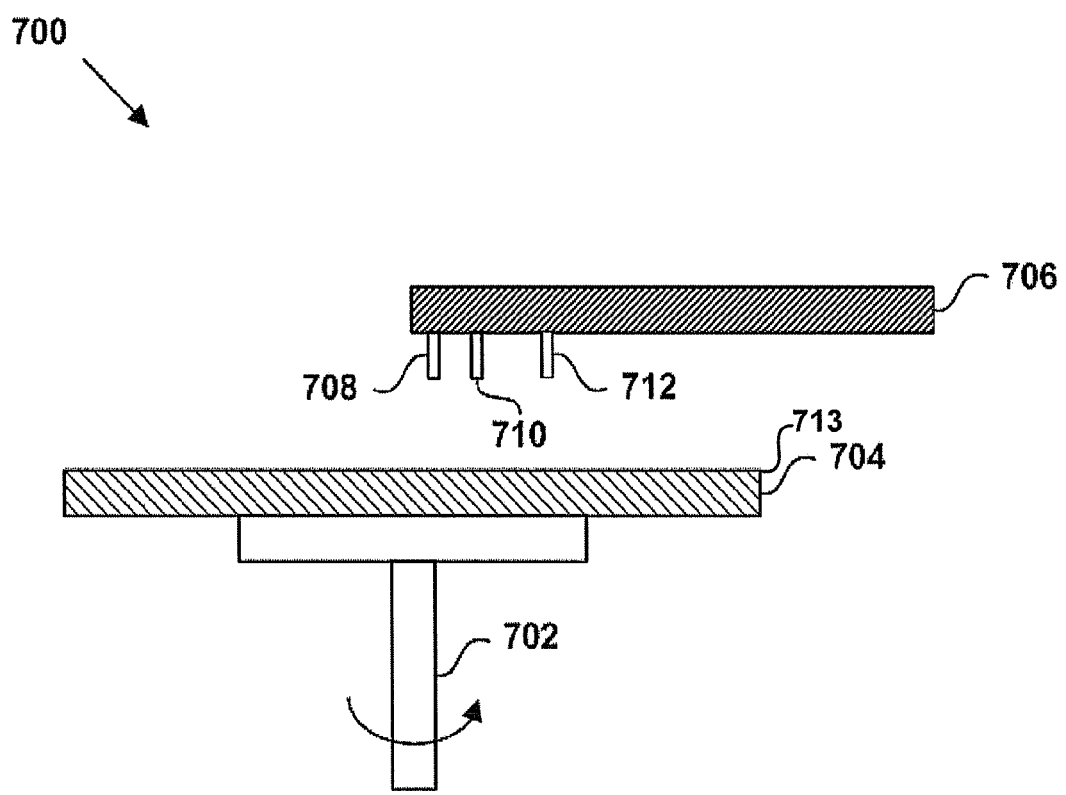
FIG. 7 is a side view of another tool used for removing a liquid from a substrate, according to another exemplary embodiment.

FIG. 7 depicts a side view of a tool 700 used for removing a liquid from a substrate 704. The tool 700 may be used for removing a liquid from a rotating substrate 704 according to another embodiment of the invention. In this embodiment, at least two liquids are supplied to the substrate 704. The tool 700 is substantially similar to the tool 100 depicted in FIG. 1; however, the tool 700 has an additional nozzle 712 to supply a second liquid. A first liquid may be supplied to the substrate 704 via nozzle 710. A second liquid may be supplied to the substrate 704 via nozzle 712. The tool 700, of course, may contain additional liquid and/or gas nozzles.

In one embodiment, the first liquid is a non-wetting liquid with respect to the substrate 704 and the second liquid is a wetting liquid with respect to the substrate 704. The term wetting liquid as used in this specification means a liquid that partly remains on the surface of the substrate when an external force, such as centrifugal force or gravity, is applied to the substrate. A contact angle between the wetting liquid and the substrate 104 may be less than 5 degrees, and preferably less than 3 degrees. The wetting liquid may substantially cover the substrate 704 in such a manner that there are no regions on the substrate 304 in which the liquid pulls together and forms droplets. If proper wetting is not performed, drying streaks on the surface of the substrate 704 may be observed, which may result in contamination of the substrate 704.

The wetting liquid may be of particular relevance for drying lyophobic substrates. Wetting may be obtained by adding one or more surfactants to the second liquid (in general water) or by adding a surface tension lowering liquid. The surfactant may be selected based on its quality of not adhering to the substrate 704. Additionally, the surfactant may be selected based on its quality of being removable by the first liquid. Alternatively, the second liquid may be a surface tension lowering substance, such as an alcohol.

The first liquid may be substantially the same as the single liquid as discussed with respect to FIG. 1. For example, the first liquid may be a non-wetting liquid, such as a rinsing liquid, a cleaning liquid and/or an etching liquid.

In certain embodiments, a gas may be supplied to the substrate 704. The gas may be supplied to the substrate 704 via nozzle 708. The gas may be an inert gas with respect to the substrate 704. For example, the inert gas may be nitrogen, argon, helium, or hydrogen. At least part of the time, the gas may be supplied substantially simultaneously with the first and second liquids. The nozzle 708 may be turned on if both the liquids and the gas are supplied to the substrate 704. However, the nozzle 708 may be turned off if only the liquids are supplied to the substrate 704.

The following example is provided to further explain this system and method of removing liquid from a substrate. In this example, using the apparatus as shown in FIG. 7, two liquid nozzles 710, 712 were mounted on a moveable arm 706. The nozzles 710, 712 were spaced close enough to each other so that a wet zone appeared on the surface of the substrate 704 between the flow of liquid supplied by the nozzles 710, 712. The substrate 704 was HF-last silicon, similar to the substrate used in the example provided with respect to FIG. 1.

The rotating substrate 704 was supplied substantially simultaneously with the two liquids, the first and second liquids, by the nozzles 710, 712. Each liquid had different wetting properties. The nozzle closer to the center of the substrate 704 (e.g., nozzle 710) supplied a non-wetting liquid to the substrate 704, so that a dry zone was created on the substrate 704 between the liquid front and the center of the substrate 704. The second nozzle (e.g., nozzle 712) supplied a liquid that could wet the surface, so that the non-dried zone was wet.

In this example, the nozzle 712 sprayed ultra pure water containing a surfactant. The two nozzles 710, 712 were moved, one after the other, from substantially the center to the edge 713 of the substrate 704. When the two nozzles 710, 712 followed each other, from substantially the center to the edge 713 of the substrate 704, the liquid-covered rotating substrate was transformed into a dry substrate.

Figure 8:
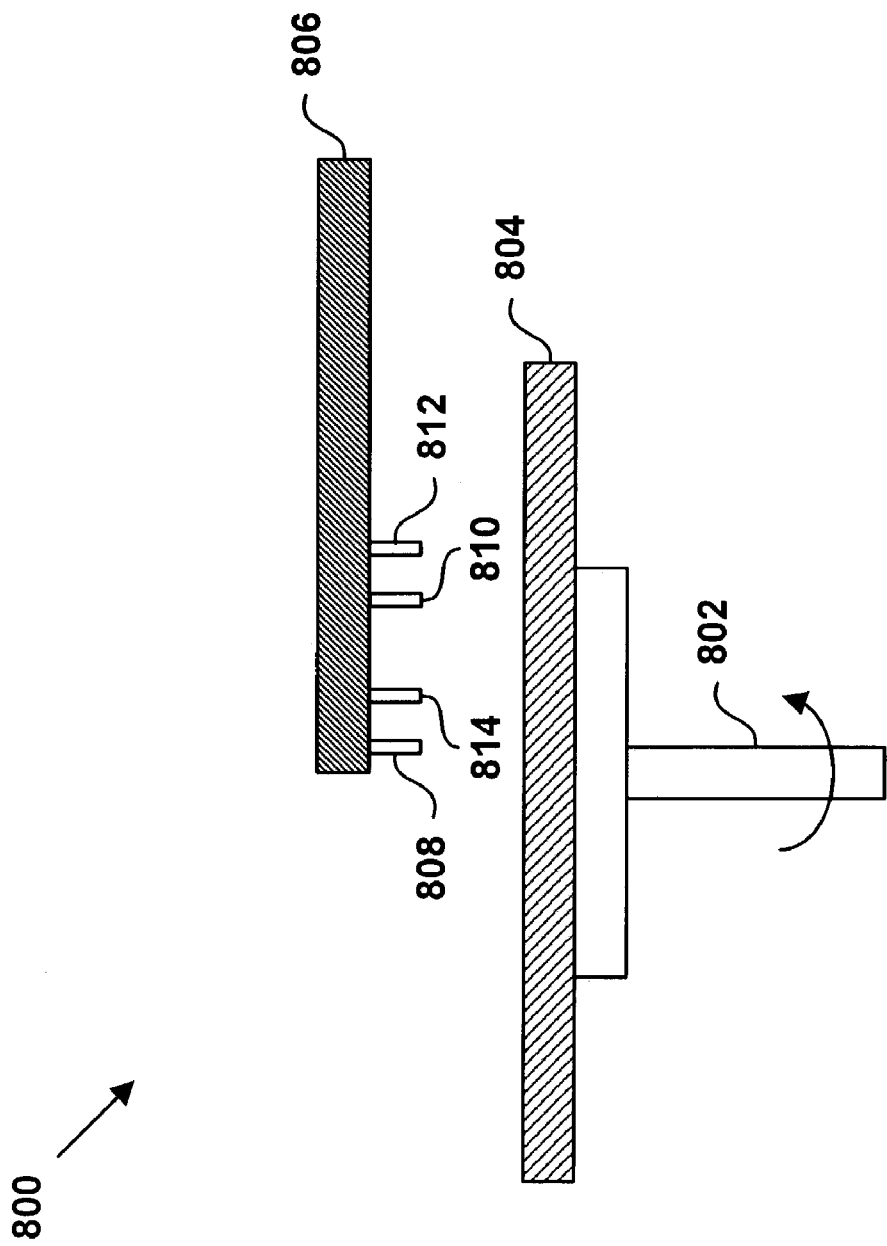
FIG. 8 is a side view of another tool used for removing a liquid from a substrate, according to another exemplary embodiment.

FIG. 8 is a side view of a tool 800 used for removing a liquid from a substrate, according to another exemplary embodiment. In this embodiment, at least one gas and at least one liquid are supplied to the substrate 804. The tool 800 is substantially the same as tool 700 as depicted in FIG. 7; however, the tool 800 has an additional nozzle 814 to supply a second gas. The tool 800 may contain additional liquid and/or gas nozzles.

A first gas may be supplied by nozzle 808. The first gas may be an inert gas with respect to the substrate 804. For example, the inert gas may be nitrogen, argon, helium, or hydrogen. A second gas may be dispensed by nozzle 814 and may be a surface tension lowering gas. As described above with reference to FIG. 7, nozzle 810 may dispense a non-wetting liquid and nozzle 812 may dispense a wetting liquid. In this manner, tool 800 may dispense one or two liquids (depending on whether nozzle 812 is turned on or off) and may dispense no gas, one gas, or two gasses (depending on whether nozzles 808 and 814 are turned on or off). At least part of the time, the gas may be supplied substantially simultaneously with the liquids.

FIG. 9 shows a table summarizing some of the possible configurations of the embodiments discussed in the present application. This table is provided as a summary only and in no way limits the scope of the invention.

Figure 10:
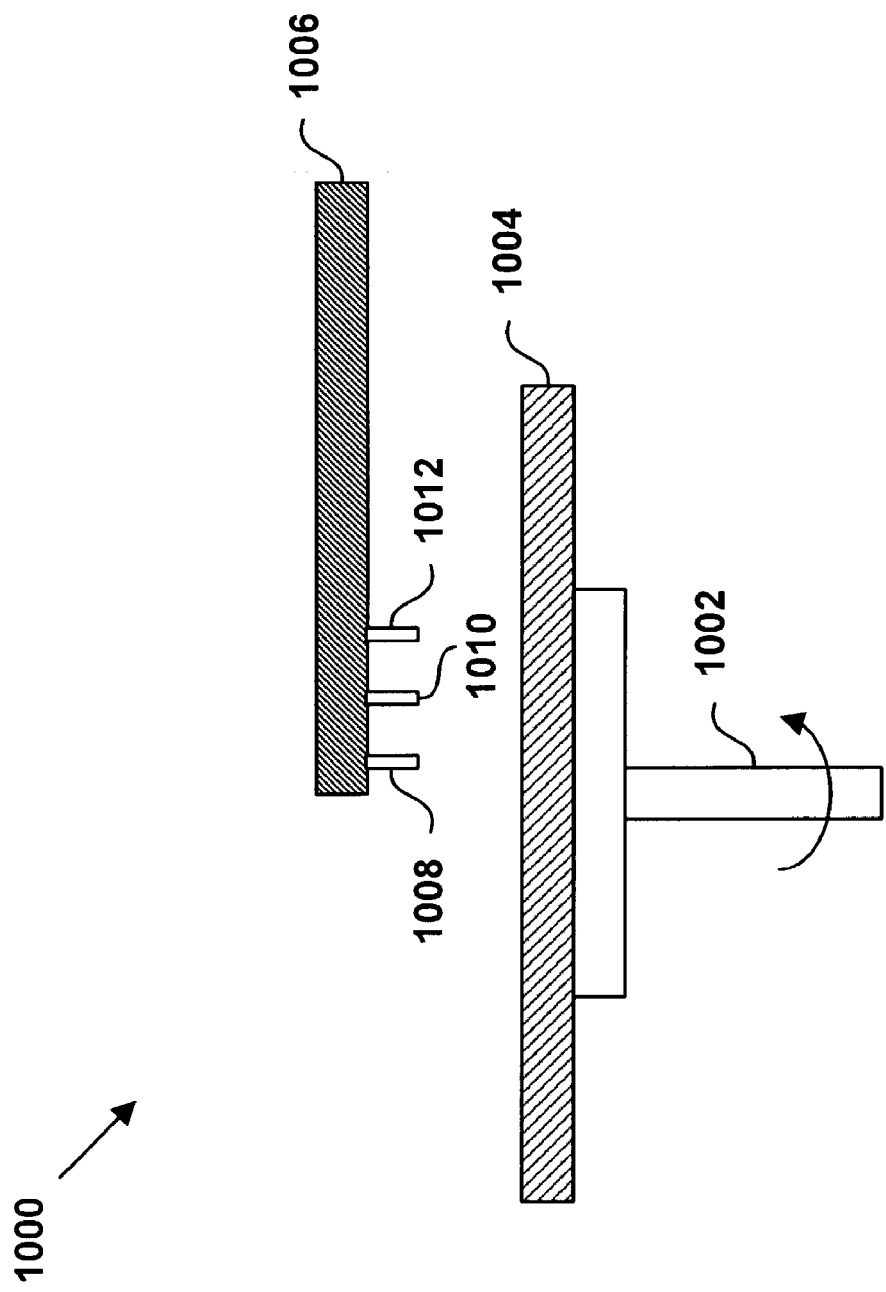
FIG. 10 is a side view of another tool used for removing a liquid from a substrate, according to another exemplary embodiment.

FIG. 10 is a side view of another tool 1000 used for removing a liquid from a substrate 1004, according to another exemplary embodiment. The tool 1000 may be used for removing a liquid from a rotating substrate 1004. In this embodiment, at least three liquids are supplied to the substrate 1004. The tool 1000 has three nozzles for supplying three liquids. A first liquid may be supplied to the substrate 1004 via nozzle 1008. A second liquid may be supplied to the substrate 1004 via nozzle 1010. A third liquid may be supplied to the substrate 1004 via nozzle 1012. The tool 1000, of course, may contain additional liquid and/or gas nozzles.

The nozzles 1008-1012 are mounted on a moveable arm 1006 such that the nozzle 1010 is between nozzle 1008 and nozzle 1012. Additionally, the nozzle 1008 is mounted closest to a distal end of the moveable arm 1006. In this arrangement, if all three nozzles 1008-1012 are activated and the arm 1006 is moved from the center to the edge of the substrate 1004, the third liquid supplied by the nozzle 1012 would reach the edge of the substrate 1004 first, followed by the second liquid supplied by the nozzle 1010, and then followed by the first liquid supplied by the nozzle 1008.

The first liquid may be a first wetting liquid. For example, the first liquid may be a surface tension lowering substance, such as a mixture of isopropyl alcohol and nitrogen gas ($N_2$). A bubbler providing nitrogen gas filled with isopropyl alcohol may be used to supply the isopropyl alcohol and nitrogen gas mixture. The second liquid may be an ultra pure water, such as de-ionized water. The third liquid may be a second wetting liquid. The second wetting liquid may be pure isopropyl alcohol, a diluted isopropyl mixture (e.g., 20% isopropyl alcohol and 80% water), or a surfactant-water mixture (e.g., a mixture with surfactant at 0.01 vol %). The three nozzles 1008-1012 may be turned on and off individually, so that no liquid is applied to the substrate 1004 or any combination of the three liquids may be applied to the substrate 1004.

The following experimental results are provided to further explain this system and method of removing liquid from a substrate. The experiments were performed at room temperature. In these experiments, the substrate 1004 is a HF-last treated 200 mm silicon wafer. The substrate 1004 is hydrophobic, which means that a contact angle of an ultra pure water droplet is approximately 70 degrees. The moveable arm speed varied from 1.5 mm/sec to 3 mm/sec, while the substrate holder rotational speed was approximately 5 revolutions per second. The nitrogen flow into the bubbler was 2 standard liters per minute (SLM). Additionally, the water flow rate was approximately 2 ml/sec and the wetting liquid flow rate was approximately 1 ml/sec.

FIG. 11 is a table summarizing which nozzles 1008-1012 were activated for experiments labeled experiment 1.1 and experiment 1.2 as described below.

In experiment 1.1, initially nozzles 1008 and 1010 were on (open) and nozzle 1012 was off (closed). When just the nozzles 1008 and 1010 were on, a rapid change in wetting of the outer area, or non-dried area, of the substrate 1004 was observed. This is typical for a rotating wafer when water is added to the surface. To overcome this situation, the nozzle 1012 was then turned on (opened).

A wetting liquid was supplied to the substrate 1004 through the nozzle 1012. This resulted in a full wetting of the non-dried area. By supplying the wetting liquid to the substrate 1004, the non-dried area can be kept wet, potentially avoiding any problems created by rapidly changing the non-dried area from dry to wet. By moving the three activated nozzles 1008-1012 from substantially the center to the edge of the substrate 1004, the substrate 1004 is dried.

In experiment 1.2, the same experimental set up described with respect to experiment 1.1 was used, except that the nozzle 1008 was off. As before, initially the nozzle 1012 was also off. Accordingly, in this part of the experiment only the nozzle 1010 was on. The nozzle 1010 supplied a non-wetting liquid, such as the ultra pure water, to the substrate 1004. This experiment was performed using an ⅛ inch outer-diameter nozzle, a flow rate of approximately 2 ml/sec, a maximum arm speed of 15 mm/sec, and a rotation speed of 5 revolutions per minute.

As the substrate 1004 was rotating, the nozzle 1010 was moved with a certain speed from the center to the edge over the rotating substrate 1004. By doing so, the liquid was removed from the surface of the substrate 1004 using centrifugal forces. A dry zone was created in the center of the substrate 1004, which then extended to the edge of the substrate 1004 as the nozzle 1010 moved towards the edge of the substrate 1004. The substrate 1004 was dried and the particle performance was close to particle neutral.

Accordingly, the rinse and dry processes in semiconductor manufacturing can be integrated by supplying ultra pure water to the surface of a substrate as described above. The ultra pure water will not wet the surface, as there is a contact angle of approximately 70 degrees, and as the nozzle 1010 moves from the center to the edge of the substrate 1004, the substrate 1004 will be rinsed and dried without creating significant defects.

Experiment 1.2 continued with the activation of the nozzle 1012. As in experiment 1.1, a wetting liquid was supplied to the substrate 1004 through the nozzle 1012. This resulted in a full wetting of the non-dried area. The nozzles 1010 and 1012 were close enough to each other that no dewetted zone appeared between them. The nozzle 1010 supplied a non-wetting liquid to the substrate 1004 such that a dry zone was created on the substrate 1004 between the liquid front and the center of the substrate 1004. The nozzle 1012 supplied a wetting liquid, which kept the non-dried area wet. By moving the two activated nozzles 1010-1012 from substantially the center to the edge of the substrate 1004, the substrate 1004 was dried.

FIG. 12 is a table summarizing which nozzles 1008-1012 were activated for experiments labeled experiment 2.1, experiment 2.2, and experiment 2.3 as described below. In these experiments, the remaining liquid film left on the substrate 1004 after performing different drying techniques was studied. It is expected that the remaining liquid film will evaporate. All tests were performed at a rotation speed of 5 revolutions per second.

The remaining liquid film was studied for the different drying techniques by using a salt test. KCl was added at a concentration of 0.1 wt % to either the ultra pure water supplied by nozzle 1010 or the wetting solution supplied by nozzle 1012. The salt tests were performed using two different types of substrates: hydrophilic wafers (HFL) and hydrophobic wafers (HFB). The hydrophilic wafers were IMEC-cleaned P-monitor 200 mm <100> Cz silicon wafers, while the hydrophobic wafers were IMEC-cleaned, without $O_3$ in the final rinse, P-monitor 200 mm <100> Cz silicon wafers.

IMEC-cleaned wafers are wafers that have gone through the following processing steps. First the wafers are immersed in a $H_2SO_4/O_3$ (98%/4 l/min) solution at 90 degrees Celsius for approximately five minutes. The wafers are then hot rinsed at room temperature to 65 degrees Celsius for approximately eight minutes. The wafers are then immersed in an HF/HCl (0.5%/0.5M) solution at room temperature for approximately two minutes. The wafers are then rinsed with $O_3$ and HCl spiking (8-9 l/min) at room temperature for approximately ten minutes. The $O_3$ is not used in this rinse for the hydrophobic wafers. The wafers are then dried using a Marangoni dry with HCl spiking (120 ml/min) at room temperature for approximately nine minutes.

Figure 13:
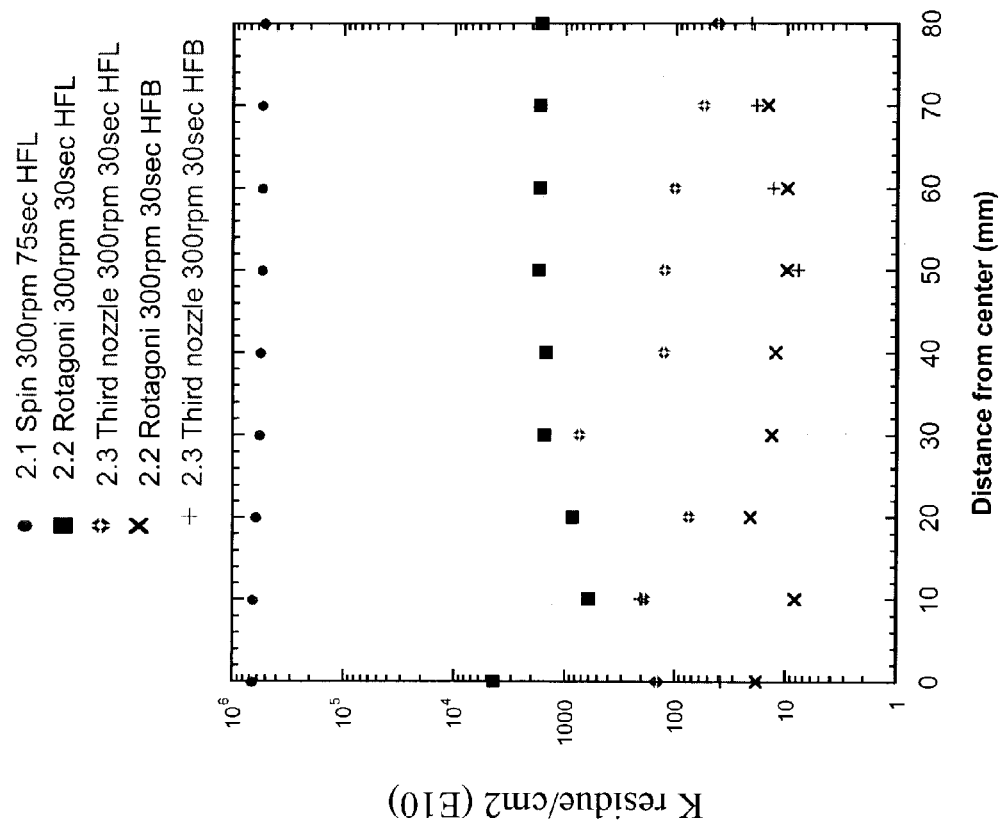
FIG. 13 is a graph providing experimental test results obtained after using the tool of FIG. 10.

After drying experiments 2.1, 2.2, and 2.3, the wafers were inspected by a Total Reflection X-ray Fluorescence instrument (TRXF Atomika 8010) to determine the thickness of the remaining KCl on the wafer. FIG. 13 is a graph of the experimental results.

In experiment 2.1, none of the nozzles 1008-1012 were activated. Essentially, the substrate 1004 was dried using just the rotation of the substrate 1004 to dry the substrate 1004 (e.g., spin drying). As seen in FIG. 13, this drying method resulted in the most KCl residue remaining on the wafer after drying.

In experiment 2.2, nozzles 1008 and 1010 were activated, while nozzle 1012 was deactivated, which is an embodiment of the invention that uses a technique that my be referred to as the Rotagoni™ method, as noted in FIG. 13. The KCl was added to the ultra pure water being supplied by nozzle 1010. Both nozzles were moved from substantially the center towards the edge of the substrate 1004. As may be seen in FIG. 13, the Rotagoni™ method of drying performed better than the spin drying method. The evaporated film thickness was determined using the data from the TRXF and the known KCl solution. After calculating the evaporated film thickness, it was observed that for spin drying, a water-layer on the order of 7 mm (~$10^{16}$ K-ions/cm$^2$) was measured and for the Rotagoni™ method, a water-layer on the order of 20-30 nm (~$10^{13}$ K-ions/cm$^2$) was measured.

In experiment 2.3, all three nozzles 1008-1012 were activated. The KCl was added to the wetting solution supplied by nozzle 1012. As shown in FIG. 13, most of the KCl was rinsed by the ultra pure water supplied by nozzle 1010 and removed by drying, down to a level of $\sim 10^{12}$ K-ions/cm$^2$ for hydrophilic substrates (indicated as HFL in FIG. 13). Additionally, the hydrophobic substrates (indicated as HFB in FIG. 13) have similar results for the Rotagoni™ method described above and the drying method using all three nozzles 1008-1012, both on the order of $\sim 10^{11}$ K-ions/cm$^2$. This represents an effectively complete dry on a hydrophobic material, as the number of K-ions/cm$^2$ noted measured corresponds to the amount of cation exchange sites on such a substrate wafer.

Preferred embodiments of the present invention have been described herein. It is to be understood, of course, that changes and modifications may be made in the embodiments without departing from the true scope of the present invention. The claims should not be read as limited to the described order of elements unless stated to that effect. Therefore, all embodiments that come within the scope and spirit of the following claims and equivalents thereto are claimed as the invention.

What is claimed is:

1. A method of removing a liquid from at least a part of a surface of a substrate, the substrate defining an outer edge, the method comprising:
    providing a first wetting liquid comprising isopropyl alcohol from a first supply on a portion of the surface of the substrate, wherein the first supply is affixed to a moveable arm;
    providing a non-wetting liquid consisting of water on the portion of the surface of the substrate from a second supply after supplying the first wetting liquid to the portion of the surface of the substrate, wherein the second supply is affixed to the moveable arm;
    providing a second wetting liquid consisting of a surfactant/water mixture on the portion of the surface of the substrate from a third supply after supplying the non-wetting liquid to the portion of the surface of the substrate, wherein the third supply is affixed to the moveable arm; and
    moving the moveable arm relative to the substrate,
    wherein the first, second, and third supplies move closer to the outer edge of the substrate with the second supply spaced further away from the outer edge of the substrate than the first supply; and
    wherein the first supply provides the first wetting liquid to the portion of the surface of the substrate and the second supply thereafter provides the non-wetting liquid to the portion of the surface of the substrate, and the third supply thereafter provides the surfactant/water mixture to the portion of the surface of the substrate as the first, second, and third supplies move closer to the outer edge of the substrate,
    whereby moving the moveable arm relative to the substrate removes the liquid from at least a part of the surface of the substrate.

2. The method of claim 1, wherein the first wetting liquid is supplied in order to obtain a complete wetting of the at least part of the surface of the substrate.

3. The method of claim 1, wherein the first wetting liquid further comprises nitrogen gas.

4. The method of claim 1, wherein the water is de-ionized water.

5. The method of claim 1, further comprising providing centrifugal force on the first and second wetting liquids and the non-wetting liquid, wherein the force is applied in the direction of movement of the moveable arm.

6. A method according to claim 1, wherein at least a part of the surface of the substrate is lyophobic, lyophilic, or a mixture of both.

7. The method of claim 5, wherein the substrate is rotated around its own center, and wherein the direction of movement of the moveable arm is away from the center of the substrate.

8. The method of claim 5, wherein the substrate is rotated off-center.

9. The method of claim 5, wherein the substrate is rotated about a center, at a rotational speed within a range of approximately 2 to 40 revolutions per second.

10. The method of claim 5, wherein the substrate is rotated about a center, wherein the rotary movement has a center of rotation and an outer edge of rotation, and
    wherein the direction of movement of the movable arm is in a direction from the center of rotation to the outer edge of rotation.

11. The method of claim 7, wherein providing a first wetting liquid from a first supply comprises supplying the first wetting liquid using a first nozzle, and wherein providing a non-wetting liquid from a second supply comprises supplying the non-wetting liquid using a second nozzle and wherein providing a second wetting liquid from a third supply comprises supplying the second wetting liquid from a third nozzle.

12. The method of claim 11, wherein moving moveable the movable arm relative to the substrate comprises movement selected from the group consisting of linear movement, rotational movement, and sweeping movement.

13. The method of claim 12, wherein the nozzles are angled and the nozzles direct the first and second wetting liquids and the non-wetting liquid from substantially the center of the substrate towards the outer edge of the substrate.

14. A method of removing a liquid from at least a part of a surface of a substrate, the substrate having an outer edge, the method comprising:
    providing a first wetting liquid comprising isopropyl alcohol from a first supply on a portion of the surface of the substrate;
    providing a non-wetting liquid consisting of water on the portion of the surface of the substrate from a second supply after supplying the first wetting liquid to the portion of the surface of the substrate;
    providing a second wetting liquid consisting of a surfactant/water mixture on the portion of the surface of the substrate from a third supply after supplying the non-wetting liquid to the portion of the surface of the substrate, and
    moving the first, second and third supplies relative to the substrate,
    wherein the first, second, and third supplies move closer to the outer edge of the substrate with the second supply spaced further away from the outer edge of the substrate than the first supply; and
    wherein the first supply provides the first wetting liquid to the portion of the surface of the substrate and the second supply thereafter provides the non-wetting liquid to the portion of the surface of the substrate, and the third supply thereafter provides the surfactant/water mixture to the portion of the surface of the substrate, as the first, second, and third supplies move closer to the outer edge of the substrate,
    whereby moving the first, second, and third supplies relative to the substrate removes the liquid from at least a part of the surface of the substrate.

15. A method according to claim 14, further comprising providing an external force on the first and second wetting liquids and the non-wetting liquid, wherein the force is applied in the direction of movement of the first, second, third supplies.

16. A method according to claim 14, wherein moving the first, second and third supplies relative to the substrate comprises moving the substrate.

17. A method according to claim 14, wherein moving the first, second, and third supplies relative to the substrate comprises moving the first, second, and third supplies toward the outer edge of the substrate.

18. A method according to claim 14, wherein moving the first, second, and third supplies relative to the substrate comprises subjecting the substrate to linear movement.

19. A method according to claim 14, wherein at least a part of the surface of the substrate is lyophobic, lyophilic, or a mixture of both.

20. A method according to claim 15, wherein the external force is centrifugal force.

21. A method according to claim 15, wherein the external force is gravity.

22. A method according to claim 20, wherein the substrate is rotated about a center, and wherein the direction of movement of the first, second, and third supplies is away from the center of the substrate.

* * * * *